(12) United States Patent
Matsuoka et al.

(10) Patent No.: US 8,788,242 B2
(45) Date of Patent: Jul. 22, 2014

(54) PATTERN MEASUREMENT APPARATUS

(75) Inventors: Ryoichi Matsuoka, Yotsukaido (JP); Akiyuki Sugiyama, Hitachinaka (JP); Yasutaka Toyota, Mito (JP)

(73) Assignee: Hitachi High-Technologies Corporation, Tokyo (JP)

( * ) Notice: Subject to any disclaimer, the term of this patent is extended or adjusted under 35 U.S.C. 154(b) by 501 days.

(21) Appl. No.: 13/202,504

(22) PCT Filed: Feb. 3, 2010

(86) PCT No.: PCT/JP2010/000620
§ 371 (c)(1),
(2), (4) Date: Nov. 1, 2011

(87) PCT Pub. No.: WO2010/098017
PCT Pub. Date: Sep. 2, 2010

(65) Prior Publication Data
US 2012/0053892 A1  Mar. 1, 2012

(30) Foreign Application Priority Data
Feb. 27, 2009  (JP) ................. 2009-045047

(51) Int. Cl.
| G01B 15/00 | (2006.01) |
| G06F 15/00 | (2006.01) |
| G03F 7/20 | (2006.01) |
| G03F 1/20 | (2012.01) |
| H01J 37/317 | (2006.01) |

(52) U.S. Cl.
CPC ........ *G03F 7/70625* (2013.01); *G03F 7/70633* (2013.01); *H01J 2237/1536* (2013.01); *H01J 2237/226* (2013.01); *H01J 2237/24571* (2013.01); *H01J 2237/2809* (2013.01); *G03F 1/20* (2013.01); *H01J 37/3174* (2013.01)
USPC ............ 702/167; 250/310; 382/145; 702/155

(58) Field of Classification Search
CPC ... G03F 7/70625; G03F 7/70633; G03F 1/00; G03F 1/20; H01J 2237/1536; H01J 2237/2269; H01J 2237/24571; H01J 2237/2809; H01J 2237/2817; H01J 37/222; H01J 37/28; H01J 37/3174; H01J 2237/221; H01J 2237/24564; H01J 2237/24592; H01J 2237/2594; H01J 2237/28; G06T 2207/10061; G06T 2207/30148; G06T 7/0083; G06T 2207/20192; G06T 7/001; G06K 9/4609
USPC ............ 702/155, 167; 250/310; 382/145, 286
See application file for complete search history.

(56) References Cited

U.S. PATENT DOCUMENTS 8,311,314 B2 * 11/2012 Matsuoka et al. ............ 382/145
2007/0221842 A1   9/2007 Morokuma et al.

FOREIGN PATENT DOCUMENTS

| JP | 2001-174977 A | 6/2001 |
| JP | 2007-248087 A | 9/2007 |
| JP | 2009-128886 A | 6/2009 |
| JP | 2009-141124 A | 6/2009 |
| JP | 2010-066629 A | 3/2010 |
| JP | 2010-085138 A | 4/2010 |
| JP | 2010-097168 A | 4/2010 |

OTHER PUBLICATIONS

H. Kakinuma et al., "Information Coalition Platform to Realize Design for Manufacturability in SoC Production," Toshiba Review, vol. 62 (2007), No. 12, pp. 74-77.

* cited by examiner

*Primary Examiner* — John H Le
(74) *Attorney, Agent, or Firm* — McDermott Will & Emery LLP (57) ABSTRACT

It is the object of the present invention to provide a pattern measurement apparatus which suitably evaluates a pattern formed by a double patterning method prior to a transfer using masks or which suitably evaluates a deviation of patterns formed by the double patterning method. To achieve the object, a pattern measurement apparatus is proposed which performs an exposure simulation on data about contour lines obtained by converting the pattern edges of first and mask images formed based on charged-particle beam irradiation of the two masks used for subsequent double exposure and which overlaps two exposure-simulated contour lines based on the coordinate information of design data about the masks. Furthermore, a pattern dimension measuring apparatus is proposed which sets measurement conditions using a charged-particle beam based on the positional information about parts or portions separated for double exposure.

4 Claims, 11 Drawing Sheets

PATTERN MEASUREMENT APPARATUS

RELATED APPLICATIONS

This application is the U.S. National Phase under 35 U.S.C. §371 of International Application No. PCT/JP2010/000620, filed on Feb. 3, 2010, which in turn claims the benefit of Japanese Application No. 2009-045047, filed on Feb. 27, 2009, the disclosures of which Applications are incorporated by reference herein.

TECHNICAL FIELD

The present invention relates to method and apparatus for measuring semiconductor devices or the like and, more particularly, to measurement method and apparatus adapted to evaluate a pattern formed by a double patterning technique relying on a reduction stepper.

BACKGROUND ART

A stepper (reduction projection exposure system) that is one type of semiconductor device fabrication apparatus is an apparatus that projects a pattern formed in a photomask, reticle, or the like onto a semiconductor wafer on which resist is applied while demagnifying the pattern by a projector lens.

Nowadays, as patterns have been manufactured with decreasing dimensions, a method of evaluating their performance by measuring or inspecting the formed pattern by a scanning electron microscope or the like is about to become the mainstream of semiconductor measurement and inspection. For example, in patent literature 1, a technique of evaluating the overlap of plural layers of overlapping patterns is proposed. An overlap between upper and lower layers is an important item of evaluation to make a decision as to whether or not interconnections between the upper and lower layers have been correctly made.

Furthermore, non-patent literature 1 discloses a technique which performs an exposure simulation on design data undergone OPC processing and which extracts hot spots.

CITATION LIST

Patent Literatures

Patent Literature 1: JP-A-2007-248087

Non-Patent Literatures

Non-Patent Literature 1: Toshiba Review Vol. 62, No. 12 (2007), pp. 74-77, "Information Coalition Platform to Realize DFM in SoC Production"

SUMMARY OF INVENTION

Technical Problem

Pattern sizes required by the next-generation device fabrication are much smaller than the wavelength of a light source used in steppers. A double patterning technique (double exposure technique) is available as a technique permitting further miniaturization under such conditions. Double patterning is a lithographic method that performs plural exposure steps by dividing design data about one layer into data corresponding to two masks. In this technique, k1 value is increased by dividing the design, and the degree of difficulty of lithography is lowered. As one example, a pattern for one layer is completed on a wafer by repeating first patterning→processing 1 and second patterning→processing 2.

A great problem with the double patterning is a positional deviation between first pattern and second pattern (which is also referred to as overlay accuracy or the amount of overlap deviation). Ideally, there is no amount of deviation between a first pattern and a second pattern. For example, in the case of a line pattern, it is formed as one seamless line on a wafer.

In practice, however, there is a misalignment or a pattern constriction at a pattern junction. In order to form a microscopic pattern appropriately by applying a double patterning technique, it is necessary that the deviation or the like between a first pattern and a second pattern be evaluated properly and that the deviation be fed back to the design data about the semiconductor pattern or to the production process.

However, with respect to the aforementioned constriction or the like, it is difficult to find the actual deviation unless an evaluation is made after performing a transfer using two masks. Furthermore, a part (stitched portions) of a pattern transferred by an exposure using the first mask is hidden by a pattern transferred by an exposure using the second mask. Therefore, it is difficult to precisely grasp the circumstances in which the hidden portion is formed. As a result, it is difficult to evaluate the stitched portions appropriately.

On the other hand, the technique permitting an overlap as described in patent literature 1 to be evaluated in two dimensions is quite effective in evaluating a pattern spanning plural layers. However, it is difficult to evaluate the shape of the first pattern hidden by second exposure. Furthermore, any technique for measuring relative deviation between both has not been established sufficiently.

The technique consisting of extracting hot spots from an exposure simulation explained in non-patent literature 1 and measuring the hot spots by SEM or the like is quite effective in that it is possible to perform an evaluation based on simulation results approximate to an actually transferred pattern but a technique for appropriately evaluating the pattern formed by double patterning is not explained at al.

A pattern measurement apparatus intended to appropriately evaluate a pattern formed by a double patterning method prior to a transfer using a mask or masks or a pattern measurement apparatus intended to appropriately evaluate a deviation of a pattern formed by a double patterning method is hereinafter described.

Solution to Problem

To achieve the above-described object, a pattern measurement apparatus is hereinafter proposed which performs an exposure simulation of data about contour lines obtained from pattern edges of a first mask image and a second mask image formed based on a charged-particle beam irradiation of two masks used for double exposure and which overlaps the two contour lines for which the exposure simulation has been done, based on coordinate information of design data about the masks. Furthermore, a pattern dimension measurement apparatus is proposed which sets measurement conditions using a charged-particle beam based on positional information about parts or portions separated for double exposure.

Advantageous Effects of Invention

According to the above-described configuration, the two mask images that are intrinsically different are overlapped using coordinate information possessed by design data about semiconductors. Therefore, a pattern obtained after double patterning based on accurate overlap can be imaged without performing any transfer, and a measurement based on it can be performed. In addition, measurement conditions for evaluation of stitched portions can be set without registering positional information for each of plural stitched portions.

DESCRIPTION OF EMBODIMENTS

A double patterning method is a technique of creating a first mask and a second mask for double exposure from one set of design data (layout data), exposing each separately, and finally transferring a target shape. Accordingly, if the design data is split at a location that is critical in terms of design rule, there is a possibility that the pattern geometry varies (pattern gets out of shape) in the stitched portion between the two transferred patterns. Optimization of exposure process conditions and modification of the design data can be done efficiently by using such locations as points (hot spots) managed by a measuring device or the like and performing an appropriate evaluation. Since exposures using two masks are carried out separately, quite strict accuracy is required as the stitching accuracy. For example, an overlay accuracy of less than 3 nm is required. When a pattern transferred to a semiconductor wafer is measured, the stitching accuracy can be evaluated from its performance. However, the efficiency is low because a measurement is not permitted unless a transfer is made in practice. Furthermore, if a transfer is made, patterns formed by two exposure processes are in a state in which they are partially overlapped and so it is difficult to appropriately evaluate the lower layer of pattern hidden behind the upper layer of pattern.

Various measurement methods in which a technique consisting of acquiring scanning electron microscope images of a mask split into two for double exposure based on design data, creating contour lines of pattern edges from the images, converting the contour lines into a given format (e.g., GDS format), and then performing a transfer simulation of double exposure is taken as one example of the technique for evaluating stitched portions are hereinafter described. By overlapping the two simulation results, inspection of the validity of stitched portions or evaluation of the margin relative to the overlay accuracy can be performed at high accuracy without creating a wafer.

According to the techniques described in the present embodiment including the above-described technique, advantageous effects, for example as given below, can be expected.

(1) Higher accuracy can be accomplished by using a mask topology, used for exposure in practice, in a simulation.

(2) With respect to the finish of the mask of the stitched portion between two masks split from the original design data, the validity of the finished contour can be evaluated and the amount of stitch can be managed by overlapping the two mask contour lines.

(3) Furthermore, the validity of the transferred pattern is evaluated using hot spot information obtained by the simulation.

(4) The results of a mask defect inspection can be used as a false defect filter in a shot stitch or defects can be reviewed using the defect information.

(5) Cost reduction, shortening of the fabrication period, and optimization of quality management can be done in a mask-making process.

(6) Management of the performance of a pattern on a wafer can be optimized. Systematic management of defects in a pattern on a wafer can be performed.

Figure 14:
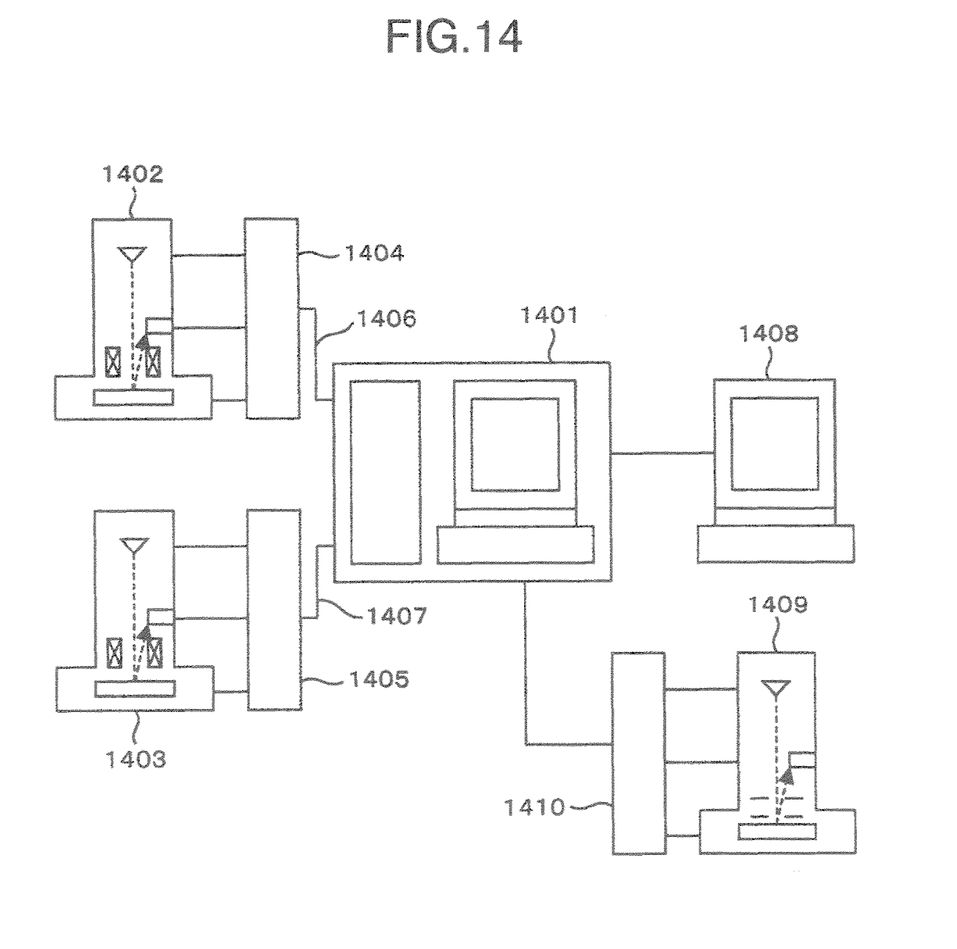
FIG. 14 is a diagram illustrating an example of system configuration for measuring a pattern formed by plural exposures.

Technique and apparatus which can judge the validity either of a pattern formed by plural exposures or of plural exposure steps or which can perform measurements and inspections are hereinafter described by referring to the drawings. FIG. 14 is a diagram illustrating one example of a system configuration for measuring a pattern formed by plural exposures from a pattern on a scanning electron microscope image (hereinafter may be referred to as the SEM image).

In the following description, an example using a scanning electron microscope (SEM) as one aspect of charged-particle beam apparatus is described. The invention is not restricted to this example. For example, a focused ion beam (FIB) apparatus that forms an image by scanning an ion beam over a sample may be adopted as a charged-particle beam apparatus. In order to measure patterns with ever decreasing dimensions at high accuracy, quite high magnification is required. Therefore, it is generally desired to use an SEM that is superior to an FIB apparatus in resolution.

FIG. 14 exemplifies a system in which plural SEMs are connected about a data management unit 1401. Especially, in the case of the present embodiment, an SEM 1402 is used to measure and inspect a pattern of photomask or reticle used mainly for semiconductor exposure processes. An SEM 1403 is used to measure and inspect a pattern transferred to a semiconductor wafer by exposures using the photomask or the like. The SEMs 1402 and 1403 are not greatly different in fundamental structure of electron microscope but are designed to cope with variations in sizes of the wafer and photomask and variations in resistance to electrical charging.

Control units 1404 and 1405 for the SEMs 1402 and 1403, respectively, are connected with the SEMs 1402 and 1403, respectively, and control necessary for the SEMs is effected. In each SEM, an electron beam released from an electron source is focused by plural stages of lenses. The focused electron beam is scanned over the sample in one or two dimensions by a scanning deflector.

Secondary electrons (SE) or backscattered electrons (BSE) released from the sample in response to the scanning of the electron beam are detected by a detector and stored on a storage medium such as a frame memory in synchronism with the scanning of the scanning deflector.

The scanning by the scanning deflector can be performed regarding any arbitrary size, position, and direction, and permits scanning for forming an image (described later) or selective scanning to edge portions.

The control or the like described so far is carried out by the control units 1404 and 1405 for the SEMs. Images and signals obtained as a result of the scanning of the electron beam are sent to the data management unit 1401 via communication lines 1406 and 1407. In the description of the present example, each control unit controlling a corresponding SEM and the data management unit performing measurements based on the signal obtained by the SEM are separate units. The invention is not restricted to this configuration. The data management unit may perform both control of the equipment and measurement processing. Instead, each control unit may perform both control of an SEM and measurement processing.

A program for executing measurement processing is stored in the data management unit or in the control unit. Measurements or calculations are performed according to the program. Design data about a photomask (hereinafter may be simply referred to as a mask) or a wafer used in semiconductor fabrication steps is stored in a design data management unit. The design data is represented, for example, by a GDS format, OASIS format, or the like and stored in a given format. No restrictions are imposed on the kind of the design data as long as software that provides a display of the design data can display the format and treat it as graphical data. Furthermore, the design data may be stored on a storage medium provided independent of the data management unit. A simulator (not shown) is connected with the data management unit 1401 and transmits a contour line extracted from an SEM image to the simulator. Furthermore, the simulator sends a layout shape taking account of fabrication process conditions to the data management unit 1401. Software for simulations can be executed by the data management unit 1401.

The data management unit 1401 is equipped with a function of creating a program (recipe) for controlling the operation of the SEMs based on the design data about semiconductors, and acts also as a recipe setting portion. In particular, it creates a program for setting positions and so on for performing processing necessary for the SEMs such as desired measurement points on design data, autofocus, Auto-Stigma, and addressing and automatically controls the SEM sample stages, deflectors, and so on based on the settings.

Figure 12:
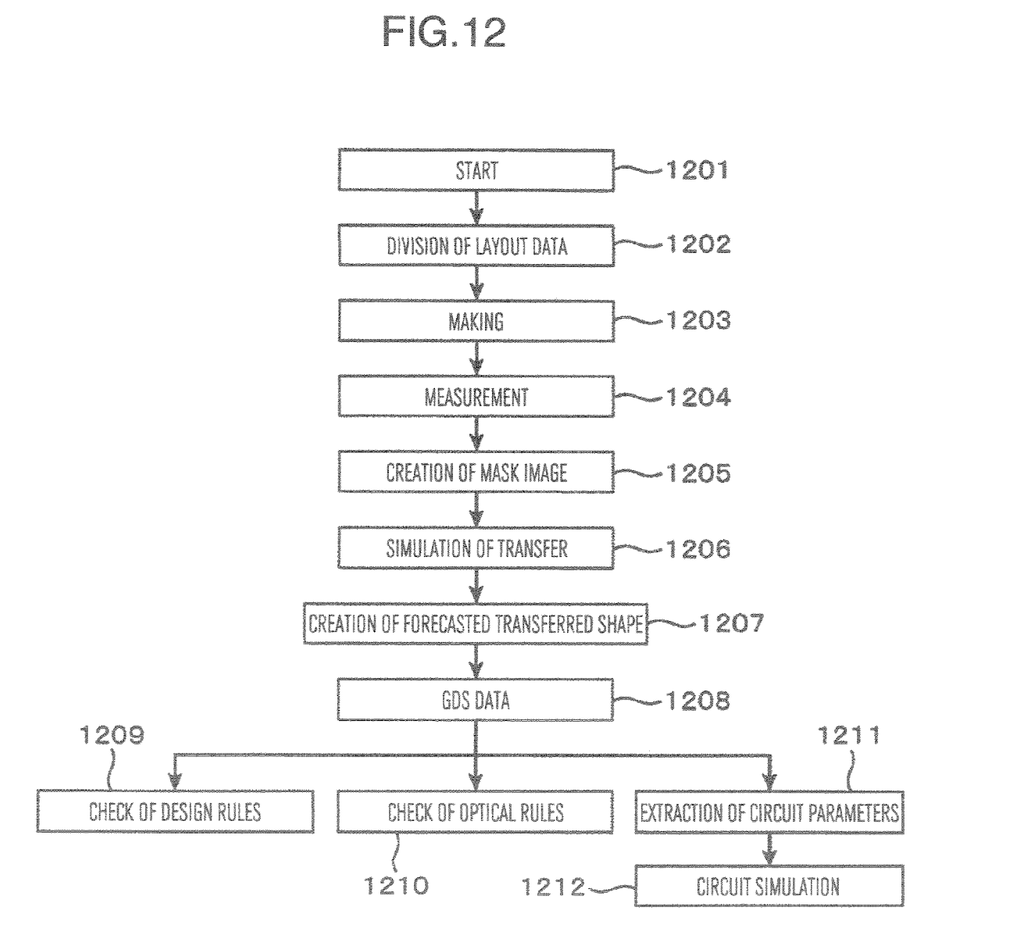
FIG. 12 is a chart illustrating processes for evaluating the validity of a pattern formed by double patterning.

Then, a process for evaluating the validity of a pattern formed by double exposure (hereinafter may be referred to as double patterning) is described by referring to FIG. 12.

First, mask layout data read from the design data is split such that exposures are performed by plural exposure processes (step 1202). Patterns are formed on a mask plate (glass plate) or the like by an electron beam lithography system or the like based on the respective sets of layout data to make masks (step 1203).

Then, the two or more masks made are measured by the use of the above-described SEM 1402 (step 1204). The contour line of the pattern is extracted based on an image obtained by the SEM 1402 (step 1205). Profiling of the pattern edges is carried out, for example, by a technique consisting of profiling a brightness distribution of edges on an SEM image and interconnecting portions having the same brightness. The profiling may be done by the data management unit 1401 or by the control unit 1404.

A pattern (hereinafter referred to as an OPC pattern) for optical proximity correction (OPC) is added to the pattern formed on the glass substrate. This pattern is different in shape from a pattern actually exposed onto a semiconductor wafer. To forecast the exposed pattern shape using a reduction stepper through the use of such a photomask, a transfer simulation is performed (step 1206). A pattern shape after an exposure using a photomask pattern split into two or more is extracted. This processing is carried out by the control unit 1404 or data management unit 1401 installed in the SEM 1402.

Then, using design data stored either in the data management unit 1401 or on other storage medium or the like connected with the data management unit 1401, the contour lines of the two or more segments of the photomask pattern are overlapped. A forecasted shape transferred to a semiconductor wafer is created by double exposure (step 1207). For this overlapping, pattern matching may be performed between the layout data of the design data that has been split equivalently to the photomask and the contour lines, and the two parts of the contour line data may be coupled together utilizing the positional information of the design data. Various techniques can be applied for the pattern matching. Especially, with respect to data converted into contour lines, it is easy to extract vector data. Therefore, pattern matching between vector data is also possible.

Furthermore, matching between the layout data and contour line data can be performed using a unique pattern.

The contour line data formed as described so far is stored as GDS data together with the positional information onto the storage medium (step 1208).

DRC (design rule check: step 1209), ORC (optical rule check; step 1210), LPE (circuit parameter extraction: step 1211), and so on are carried out on the GDS data created as described so far. These various verifications can be carried out accurately by precisely forming the contour lines of the pattern after the double exposure as described previously. Especially, with respect to the aforementioned LPE, accurate SPICE (circuit simulation: step 1212), calculations of delays, and so on can be performed by back-annotating the results obtained by the LPE to the netlist of the design circuit.

Figure 1:
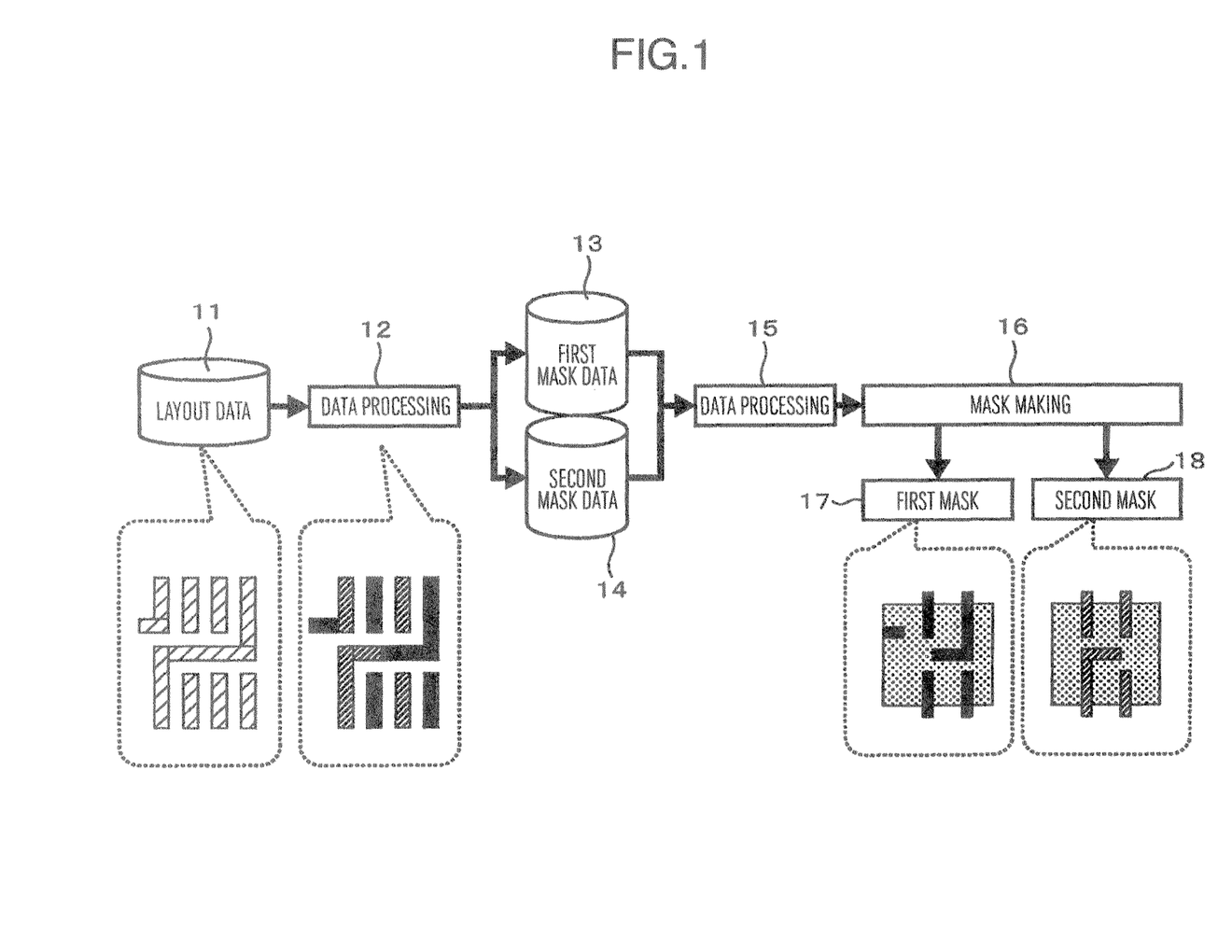
FIG. 1 is a flowchart illustrating a process for splitting layout data and fabricating masks in double patterning.

Designing of masks used for double patterning and a manufacturing process are next exemplified in FIG. 1.

First, layout data 11 indicating a circuit pattern is laid out for each layer in the same way as general semiconductor layout designs. During this design process, design verifications such as DRC (design rule check), ORC (optical rule check), and LVS (circuit collation) are completely performed. A totally error-free condition is maintained.

Then, a decision is made on the distance between adjacent geometrical figures regarding the above-described error-free layout data 11. Patterns that need double exposure are extracted. This is generally known as split processing 12. A modification is made in such a way that virtual layer numbers alternate between adjacent patterns. According to location, one closed figure is split into different virtual layers.

Data 13 and 14 about the two layers obtained in this way are subjected to MDP processing 15 and mask making 16 is performed. Thus, a first mask 17 and a second mask 18 are fabricated. The MDP (Mask Data Preparation) processing is processing for converting layout data into lithographic data such as for an electron beam lithographic apparatus. During this conversion process, candidate defective parts (for example, known as hot spots) can be extracted.

Figure 2:
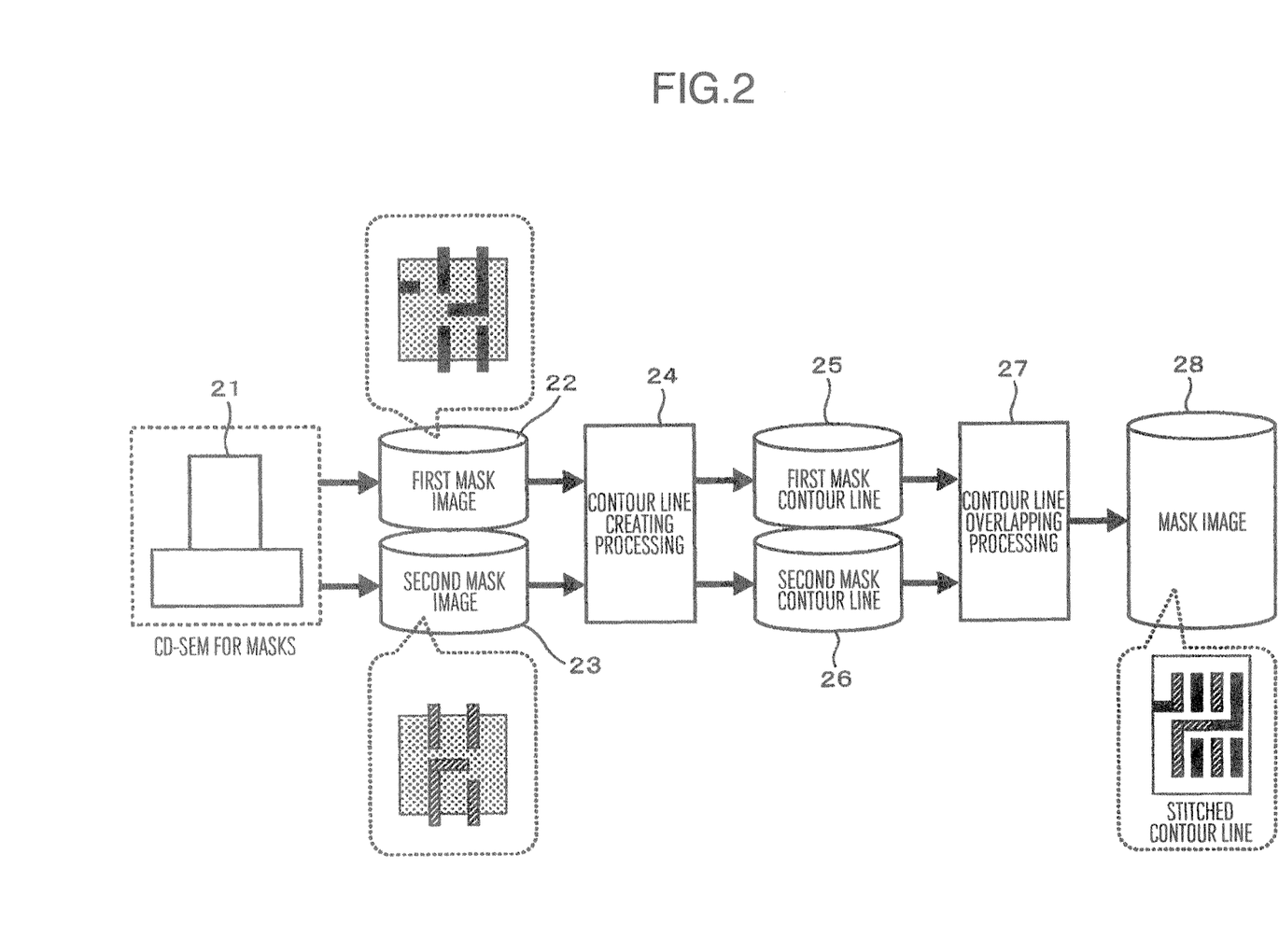
FIG. 2 is a diagram illustrating a process performed from formation of images of a split pattern to formation of a stitched image based on the images.

A method of extracting a contour shape from images of fabricated masks is next described by referring to FIG. 2. The images of the two fabricated masks are taken by a CD-SEM 21 for masks to obtain a first mask image 22 and a second mask image 23. For example, this CD-SEM for masks is the same as the SEM 1402 exemplified in FIG. 14. Positional information about parts split by splitting processing is sent, for example, to the data management unit 1401 exemplified in FIG. 14 and stored there. This positional information is used for a recipe creation described below. Depending on how the pattern of the split parts is formed, there is the possibility that the pattern exposed by the first mask and the pattern formed by the second mask are not connected appropriately. Therefore, in order to make this portion a subject of measurement, a recipe for the CD-SEM for masks is previously created by making use of the above-described positional information. The splitting processing is carried out by an external computer 1408 that runs external software for semiconductor fabrication. Necessary information is sent from the external computer 1408 to the data management unit 1401.

The data management unit 1401 determines the position of a region where an image is acquired by the SEM 1402 based on the positional information about the split portion and creates a recipe based on the information. Where a recipe is created, it is possible to automatically assign the position of a field of view (FOV) for acquiring images based on given conditions.

One conceivable example of this is to weight the degree of importance of circuit of regions to which the split portion belongs, the pattern shape, an adjacency relationship with other pattern, and so on according to their degrees. Then, the degree and so on are converted into numerical values or classified. When the numerical values, classes, or values calculated based on AND conditions thereof exceed a certain criterion, the pattern is selected as a pattern from which an image is to be taken. Furthermore, a subject of measurement is selected from among plural patterns having a similar tendency, and the FOV can be set to include the subject of measurement.

As a specific example, a location where patterns are close to each other at the stage of design data is inherently highly required to be extracted as a subject of measurement. Every such location may be used as a location from which an FOV is taken. When such a location and a split location are close to each other, the efficiency of measurement can be enhanced by making a decision to selectively choose it as an FOV acquisition location.

With respect to patterns which are close at the stage of design data, if a deviation occurs between a pattern transferred by a first mask and a pattern transferred by a second mask, there is the possibility that the patterns will come closer to each other and unrelated patterns will be connected together. Accordingly, pattern locations (regions) which are close to each other at the stage of design data are weighted more heavily. Furthermore, the split location or given regions around it are weighted more heavily than the other regions.

Thus, a region where both are overlapped can be selected as candidate FOV acquisition locations. In addition, an area where critical regions overlap may be simply selected as a candidate FOV acquisition.

With respect to the split location, portions to be joined together deviate and become connected in some cases. Since positional information about such a portion can be acquired from the external computer 1408 that performs splitting processing and processing (stitching) for appropriate connection of two patterns, FOV acquisition locations may be selected based on the positional information. Candidate FOV acquisition regions may be narrowed down by taking advantage of the aforementioned techniques.

When a recipe is created, positional information about a split portion that is a candidate for measurement is registered as GDS data, and the FOV acquisition position is selected using the data. The size of the FOV to be acquired (magnification of the SEM) can be set at will. The FOV acquisition position varies according to the set size of the FOV.

The first mask image 22 and second mask image 23 are acquired by automatic control of the SEM using the measurement recipe created as described so far. Since images taken using the recipe created based on the design data are split into images for each FOV of the SEM, the images are combined so as to overlap the design data information (to make a panorama). Contour line creating processing 24 for profiling the edges on the panoramic image is performed.

Figure 3:
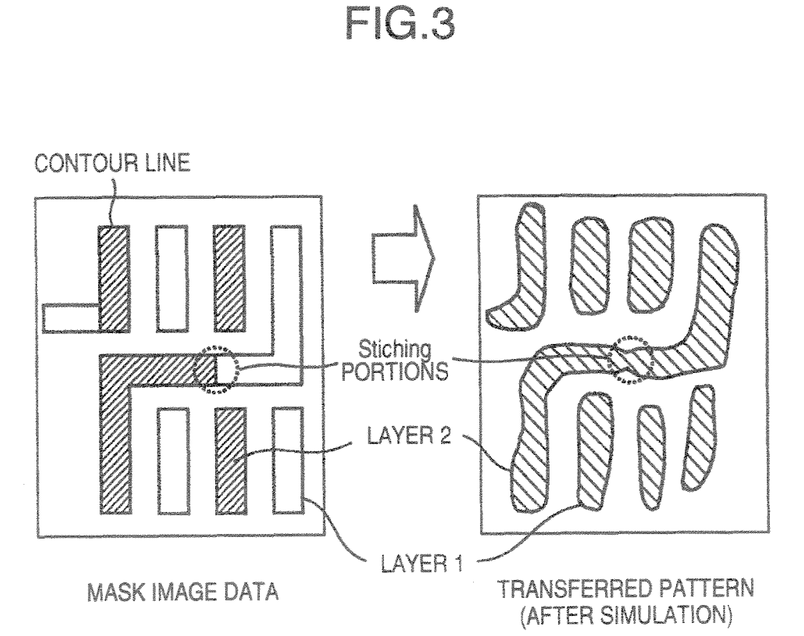
FIG. 3 is a view illustrating an example of formation of a pattern image (pattern image after a simulation) after double patterning based on acquisition of an SEM image of a mask.

Then, a transfer shape is simulated to forecast the shape. In particular, separate OPC simulations are performed using the contour line of the first mask and the contour line of the second mask obtained as described above, and forecasted data (first mask contour line 25 and second mask contour line 26) about a pattern data formed on a semiconductor wafer after a transfer is created. FIG. 3 is a view illustrating one example of a simulation image of the shape of a transferred pattern. The shape of the transferred pattern can be forecasted by performing a simulation with the use of contour lines of data obtained by imaging masks.

A general OPC simulation is performed using design data about masks and, therefore, does not contain various error factors occurring during mask making processes. It is difficult to create a precise forecasted shape.

On the other hand, contour shapes obtained from images of actual masks or reticles taken by SEM have accuracy and reproducibility equivalent to values measured by a CD-SEM. OPC simulations using such contour lines permit quite precise forecasting.

Figure 4:
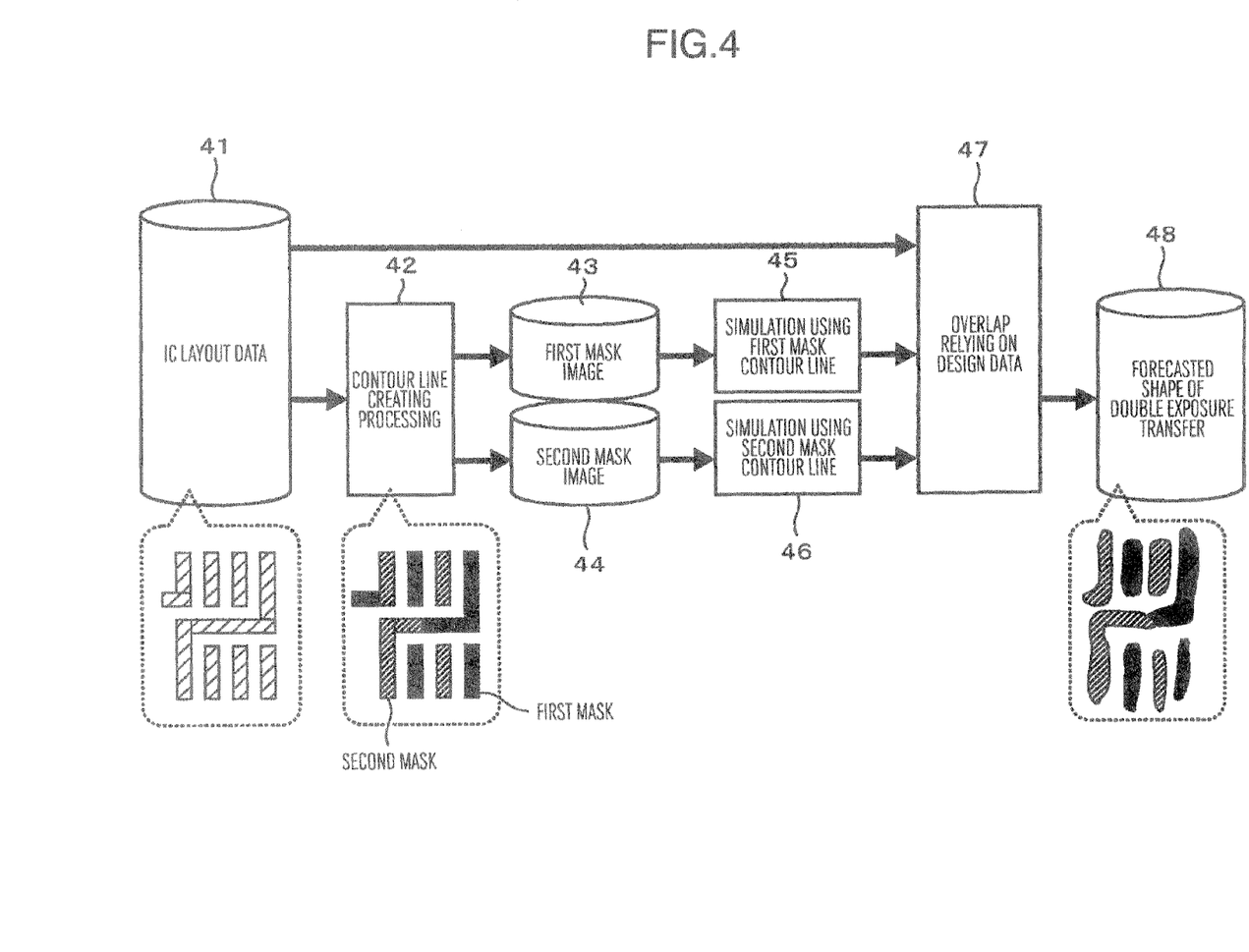
FIG. 4 is a diagram illustrating a process for creating a transferred image after double patterning based on acquisition of two mask images which have been split.

A handling process for forming a simulation image as exemplified in FIG. 3 is described by referring to FIG. 4. A first mask image 43 and a second mask image 44 are converted into contour lines, and simulations are carried out (simulations 45, 46). Images formed by the simulations 45 and 46 are overlapped using the layout data 41. In the overlapping processing, the layout data 41 represents an ideal relative positional relation between the first and second masks prior to splitting. Therefore, pattern data obtained based on an OPC simulation of the first mask and pattern data obtained based on an OPC simulation of the second mask are overlapped through the use of pattern coordinate information possessed by the layout data 41 (extraction of forecasted shape 48 of double exposure transfer).

In the present embodiment, a recipe is created using coordinate information obtained based on splitting processing on the design data, and image formation relying on SEM is carried out using the recipe. The same coordinate information as the design data is attached to the image obtained in this way, and this image is registered in a given format. That is, the image is represented by the coordinate system (e.g., GDS coordinate system) of the design data. Accordingly, the coordinate systems of the contour lines used for simulations and of the silicon pattern (pattern transferred to a semiconductor wafer) of the results of the simulations can all be represented by the coordinate system of the design data.

Specifically, two sets of pattern data obtained based on the results of two simulations have the same coordinate system information as the design data and so the two sets of pattern data can be overlapped accurately based on the original design data (layout data).

The deviation between patterns can be found with the use of the two sets of contour line information overlapped in this way. Especially, with respect to the contour line information, the contour line of the lower layer that would normally be invisibly hidden behind the upper layer is also represented and, therefore, the degree and amount of overlap can also be found precisely.

Pattern data obtained as a result of an overlap of the results of the two simulations as described so far represents an ideal state not containing overlay error that would be produced during exposure. A shape can be forecasted more accurately, appropriate measurement conditions can be set, the margin for overlap can be evaluated, and other operation can be performed by adding pattern affecting factors produced due to overlay error to such pattern data. Its specific examples are described below.

First, a technique of evaluating the finish of the stitched portion is described.

Where one set of layout data is split for double exposure, in order to ensure the connection of split portions, an overlapping pattern is formed across the split portions. Depending on the size of the overlapping pattern formed by the stitching or on other factor, the connected portions may be constricted or thicken.

Figure 5:
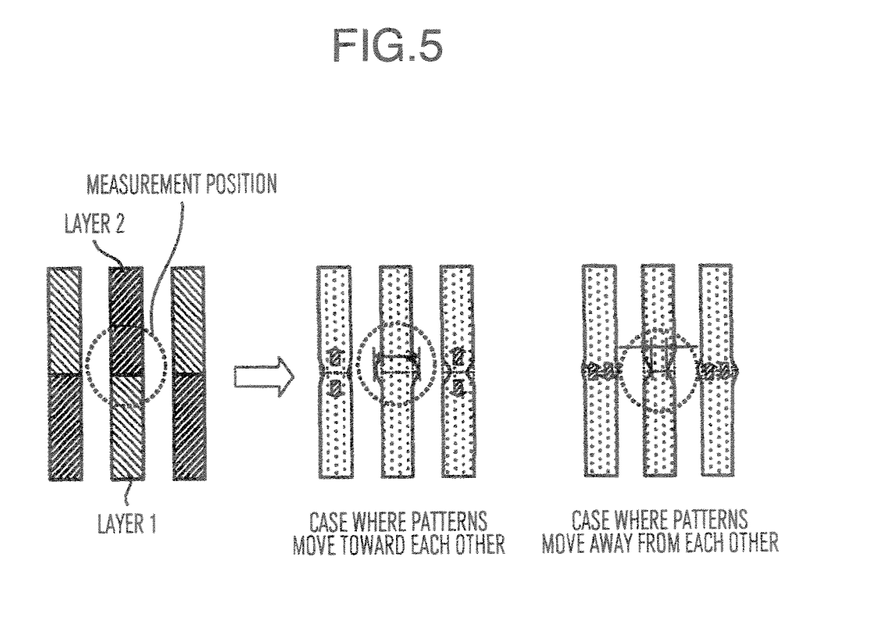
FIG. 5 is a view illustrating a dimension varying factor of a pattern formed by double patterning.
Figure 6:
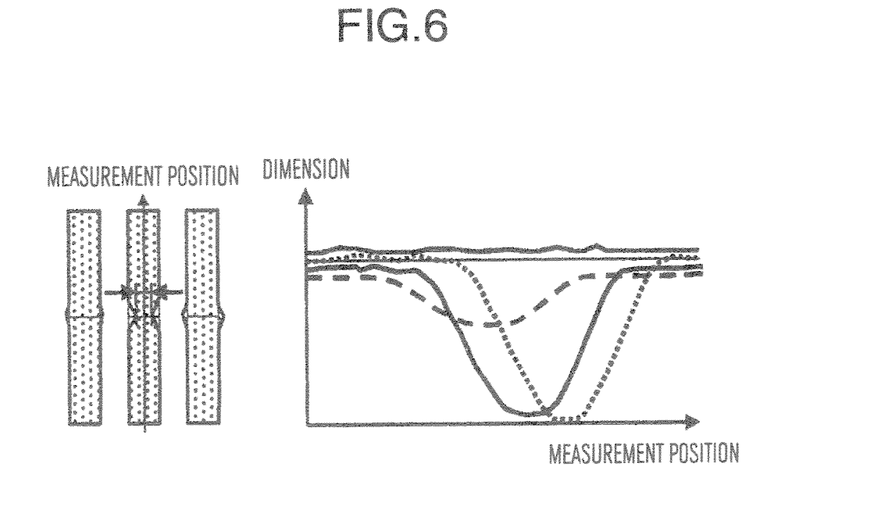
FIG. 6 is a diagram illustrating the principle on which the dimensional values of stitched portions vary depending on dimension measuring position.

For example, as shown in FIG. 5, the pattern transferred by the first mask and the pattern transferred by the second mask move toward or away from each other, thus varying the dimension. More specifically, as exemplified in FIG. 6, the value of a dimension varies greatly depending on the measuring position in the up-and-down direction as viewed in the figure (Y-direction).

Figure 7:
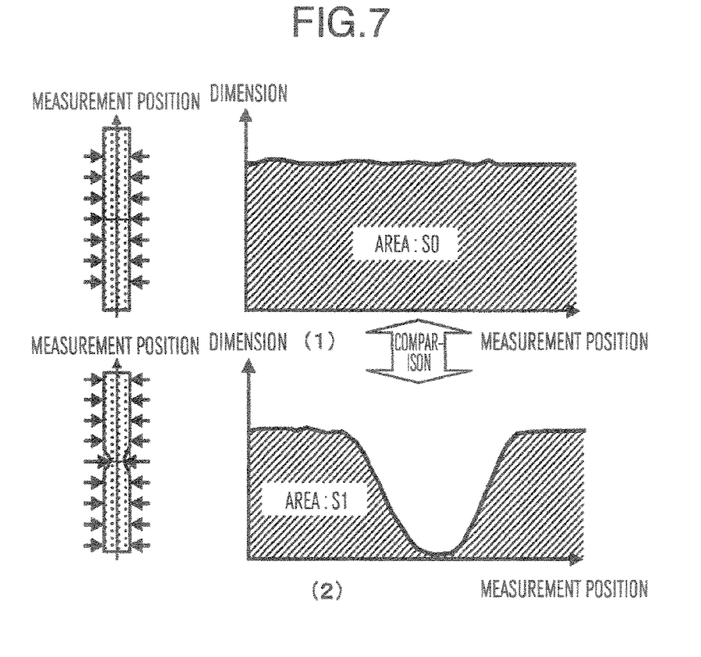
FIG. 7 is a view illustrating a technique of evaluating the performance of the stitched portions based on an area evaluation.

A technique of appropriately evaluating a stitched portion is described by referring to FIG. 7. It is desired to make a decision as to whether or not the stitched portion is appropriately evaluated by making a measurement, which, in turn, is carried out by quantifying the degree to which the overlapped portion is disturbed. In this case, with a technique of simply measuring a one-dimensional dimension, the value of the dimension becomes different depending on the measuring position and thus it is difficult to make a quantitative evaluation.

Accordingly, in the present embodiment, a technique of measuring the area of a stitched portion is proposed as a technique for quantitatively evaluating the stitched portion. In particular, as exemplified in FIG. 7, the overlapped portion is evaluated based on the values of the dimensions at plural measuring positions or on the area of the stitched portion extracted from an SEM image or an image of a contour line. More specifically, the values of dimensions obtained at plural measuring positions are recorded, fitting is done based on the values of the plural dimensions, and the area S is calculated based on the obtained function.

Such calculations make it possible to realize quantification of a disturbed portion. If the area S is greater than a certain reference value, it is meant that the amount of overlap is too great. If the area is smaller than a given reference value, it is meant that the amount of overlap is too small.

For example, when an area is evaluated, in a case where a comparison with an area S0 as exemplified in FIG. 7 is made and an area S1 is different from S0 by a given value or more, if a display to that effect is provided, then the operator can judge whether the formation of the overlapped portion is problematic (partial problem) or there is a deviation or the like in the overlap of two exposure processes (problem with the whole exposed area). Note that the area S0 is an ideal value. It may be created either based on layout data or from existing contour line data.

A measurement can be made on variations in the stitched portion within a wafer plane by performing an OPC simulation with an FEM model. It is easier to make a visual check by displaying the results of the measurement like a wafer map.

Figure 8:
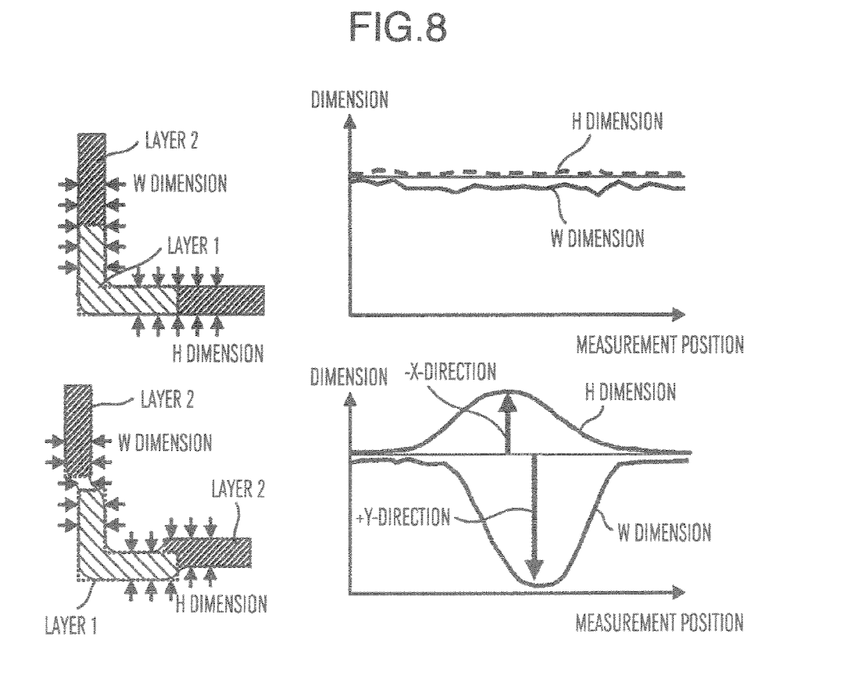
FIG. 8 is a diagram illustrating a technique of evaluating a stitched portion in a two-dimensional manner.

FIG. 8 is a view illustrating other method of evaluating a stitched portion. FIG. 8 is a view illustrating an example in which an L-shaped pattern is formed by double exposure and the dimensions at two locations or area information is used in evaluating the stitched portion. When a stitched portion is evaluated, if a pattern (layer 1) formed by a transfer using a first mask and a pattern (layer 2) formed by a transfer using a second mask as shown in the lower figure of FIG. 8 are formed with a deviation, and if only a part of the deviation is evaluated, it may not be possible to judge what nature does the deviation have. In the case of the example shown in the lower figure of FIG. 8, if one takes notice of only one stitched portion, it appears only that layer 2 deviates from layer 1 in the direction of linewidth. If two stitched portions are evaluated, layer 2 is found to be formed deviated from layer 1 upwardly and obliquely to the left.

In the present embodiment, a two-dimensional deviation between layers as exemplified in FIG. 8 is evaluated by evaluating the deviations between two or more stitched portions at the same time. More specifically, a two-dimensional deviation can be identified by measuring a deviation of a stitched portion in the direction of linewidth and, at the same time, measuring portions of plural stitched portions of the pattern in some layer 1 that are to be measured in a different direction (e.g., in the direction of linewidth).

In order to identify the state of deviation between two layers from the results of measurement obtained at plural measurement positions, portions split in the X-direction and portions split in the Y-direction are identified from positional information about the split portions obtained from the external computer 1408, and the direction of the deviation and the distance are computed based on their respective deviation information. As a simple technique, the direction of the deviation can be calculated with arctan (amount of deviation in the Y-direction/amount of deviation in the X-direction). The amount of deviation can be calculated with $\sqrt{((\text{amount of deviation in the X-direction})^2 + (\text{amount of deviation in the Y-direction})^2)}$. With respect to positions at which the amount of deviation is measured, representative portions may be selected from plural candidates for measurement. Alternatively, statistical values may be found at plural positions at which amounts of deviation in the X-direction are measured and at positions at which amounts of deviation in the Y-direction are measured, and they may be evaluated.

It is considered that the effect of generation of a deviation on a circuit differs according to the presence of an adjacent pattern, pattern shape, the kind of a circuit formed by the pattern, and so on. Therefore, the amount of deviation may be weighted for each kind of pattern and the above-described statistical values may be calculated accordingly. Additionally, the amount of deviation may be computed for each kind of pattern.

Figure 9:
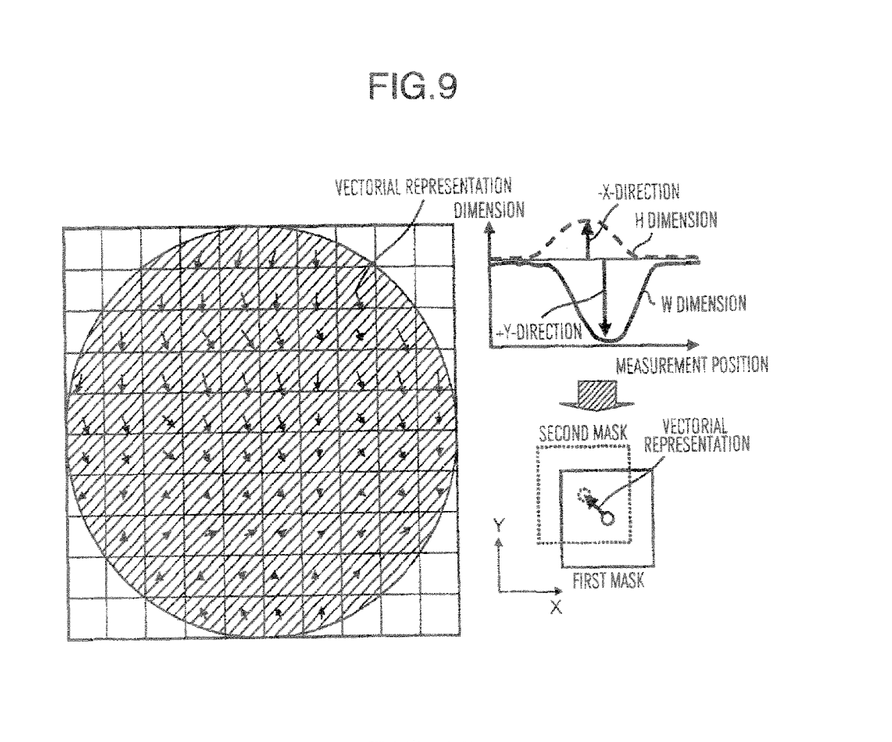
FIG. 9 is a view illustrating an example in which the results of a two-dimensional evaluation of a stitched portion are displayed like a wafer map.

It is easy to identify with what tendency is each deviation produced by causing the amounts and directions of deviations calculated as described so far to be displayed like a wafer map as exemplified in FIG. 9. Furthermore, identification of the cause of deviations is facilitated by displaying the amounts and directions of the deviations for each kind of pattern, for example, as to whether a deviation occurs in a certain pattern type, as to whether it is an overall trend not depending on the pattern type and the cause lies in the overlay accuracy of the optical exposure equipment.

Various conceivable overlay deviation factors can be narrowed down by finding a two-dimensional deviation between layers based on the results of measurements in plural directions as described so far.

A method of evaluating dangerous portions (hereinafter referred to as hot spots) produced by an overlap of two layers is next described by referring to FIG. 10.

The results of OPC simulations obtained based on measurements of a first mask and a second mask by SEM as described above are overlapped and critical portions (hot spots) produced thereby are evaluated. In particular, after the overlapping, locations at which patterns at different layers are close to each other are taken as hot spots, and the dimension between the portions is measured. Thus, the patterns are evaluated after they are overlapped. This configuration permits evaluation of the performance of the pattern finally formed on the semiconductor wafer. That is, the performance of the pattern at critical locations (hot spots) created by the overlap (that is, the width of the patterns, the value of the space between them, and so on) can be precisely evaluated.

Especially, according to the technique of the present embodiment, edge information about images of first and second masks obtained by SEM is converted into contour lines and converted into a given format such as GDS. Therefore, measurements on this data are enabled. Furthermore, a pattern formed by a transfer using a first mask and a pattern formed by a transfer using a second mask are stored as separate sets of information and so it is possible to derive what portions should be used as hot spots from the data.

Figure 10:
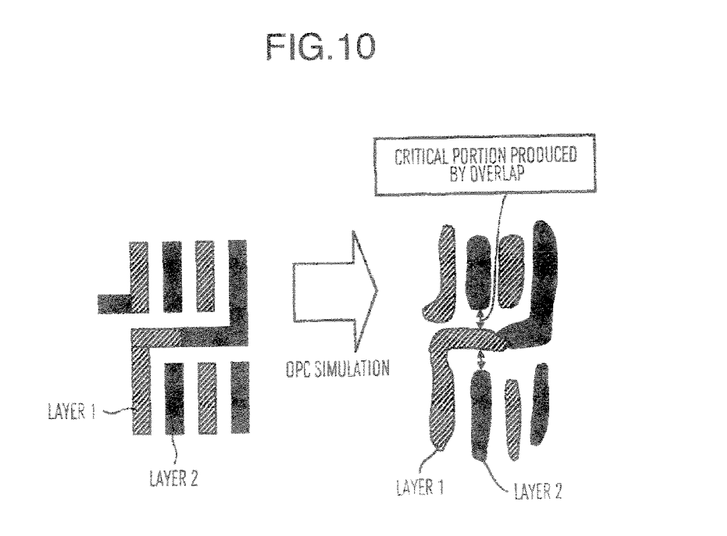
FIG. 10 is a view illustrating one example of a critical portion created by overlap of two layers.

Furthermore, images are acquired using design data as shown in FIG. 10 and so patterns are made to correspond to the first and second masks, respectively. It is possible to provide a color-coded display for the discrimination. In FIG. 10, the oblique hatching is taken as layer 1, and the marked-out pattern is taken as layer 2. Where a silicon pattern formed on a wafer by a similar technique is imaged, a similar color-coded display can be provided. This is a way that is effective in identifying patterns in wafer fabrication steps.

A method of evaluating the overlap between a layer (e.g., layer 3) formed by a transfer using other photomask and a layer formed by double patterning is next described.

A double patterning technique is applied mainly to gate step and first wiring step requiring strict design rules. Here, for example, a contour line based on a mask for forming a diffusion layer (active layer) constituting transistors or results of a simulation are superimposed on the results of a simulation of a pattern formed by the aforementioned double patterning. That is, patterns (layers 1 and 2) formed by double patterning and other pattern (layer 3) are overlapped. This technique makes it possible to optimize measurements or inspection taking account of even the presence of layer 3.

Figure 11:
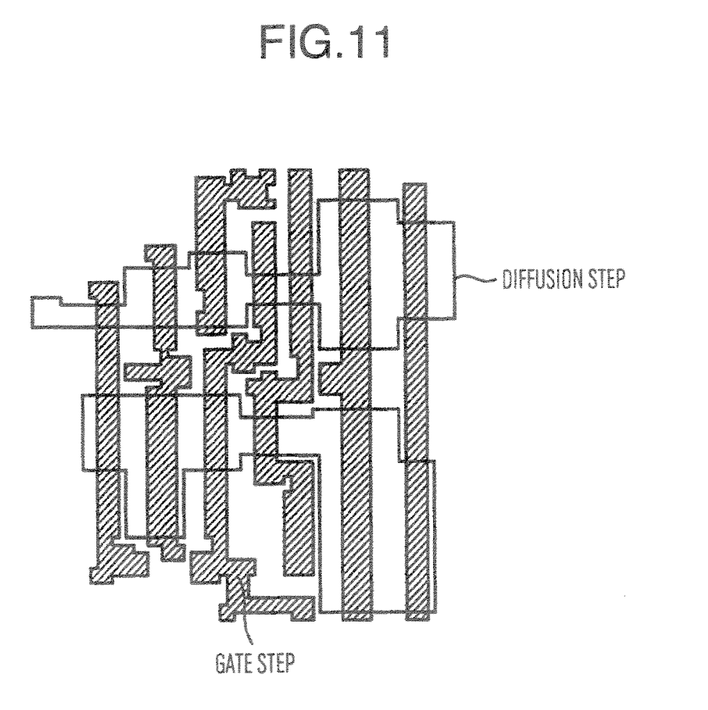
FIG. 11 is a view illustrating one example of pattern formed by plural transfer steps.

That is, as shown in FIG. 11, the following highly functional inspections, for example, can be performed by overlapping a transfer shape simulated from the mask shape of gates formed by the above-described double patterning and a shape undergone an OPE simulation using the contour line of a single mask used for a diffusion process. One is that a subject of measurement can be selected based on the weighting of hot spots, a measurement can be performed, and a decision can be made based on the measurement. Specifically, the positional relation between a diffusion layer and a gate layer constituting transistors and the degree of overlap are important evaluation items that determine the performance of the transistors. In contrast, line patterns and so on are often required to be evaluated less strictly than transistors. Accordingly, it is conceivable that strict evaluation criteria (latitude of deviations) are set for gate layer portions which are included in a pattern formed by double patterning and which overlap a diffusion layer and that milder evaluation criteria are set for other portions.

Furthermore, measurements from a circuit electrical point of view, inspections, evaluation of a two-dimensional margin for overlap (base of finished shape of contour line), or evaluation of an area (overlapping portion or protruding portion) can be accomplished easily.

In an inspection for the performance of a finished pattern, weighting taking account of a circuit characteristic point of view, as well as uniform design rules (interconnect linewidth and spacing), is done. A decision is made as to whether the performance of each pattern is acceptable or not. Thus, false errors are reduced. Errors that impact the yield greatly can be easily detected.

By overlapping gate and diffusion, the degrees of importance of protrusive portions of gates considering the mask overlay accuracy are ranked according to the amount of overlap, and an inspection is performed. Furthermore, graphical logical operations of the diffusion and gate portions constituting transistors are performed. Their areas are accurately calculated. The transistor characteristics can be managed.

A method of correcting a detected mask defect is next described. To correct a mask, a focused ion beam apparatus 1409 exemplified, for example, in FIG. 14 is used. The focused ion beam apparatus 1409 is an apparatus for performing etching by sputtering a part of a mask pattern by ion beam irradiation and performing deposition by blowing a compound gas together with an ion beam.

First, a mask defect inspection is performed on a first mask and a second mask used for double patterning. A review is performed using a CD-SEM based on the resulting defect coordinates.

At this time, defects not affecting pattern transfer are regarded as false errors and can be eliminated from the subjects of review by previously finding the correlation between the target defect coordinates and the design data.

In the case of a mask for gates, if defect coordinates are locations other than a gate pattern but are positions of diffusion, there is the possibility that the defects are not false defects. Therefore, it is determined that the defects are to be reviewed.

After the review, it is possible to make a decision regarding the effect on the defect transferability by extracting the positions of the defects from a mask image taken by CD-SEM and performing an OPC simulation using contour lines.

In this way, the effect on the transferability of defects is inspected by using a decision on the degrees of importance of defects or simulations using design data. Then, a mask correction is made only on portions that need mask correction by the use of a mask correction tool using a focused ion beam as described previously.

By making the above-described decision regarding the degrees of importance of defects, the costs of inspecting masks and making modifications can be curtailed.

Furthermore, mask portions to be modified are measured using CD-SEM. A contour shape is extracted from their image. Using the contour shape, a simulation is performed. Thus, the transferability of the locations to be corrected can be confirmed.

A control unit 1410 for the focused ion beam apparatus 1409 directs an ion beam at a desired position on an object to be processed by movement of a sample stage and beam deflection using a deflector, based on positional information obtained from the data management unit 1401.

As described so far, control or the like of other apparatus can be accomplished exploiting intrinsic information obtained from each apparatus by controlling plural charged-particle beam apparatuses using contour lines formed based on SEM images registered in the data management unit 1401, simulation results, and data obtained by converting those data into the same data format as the design data.

Figure 13:
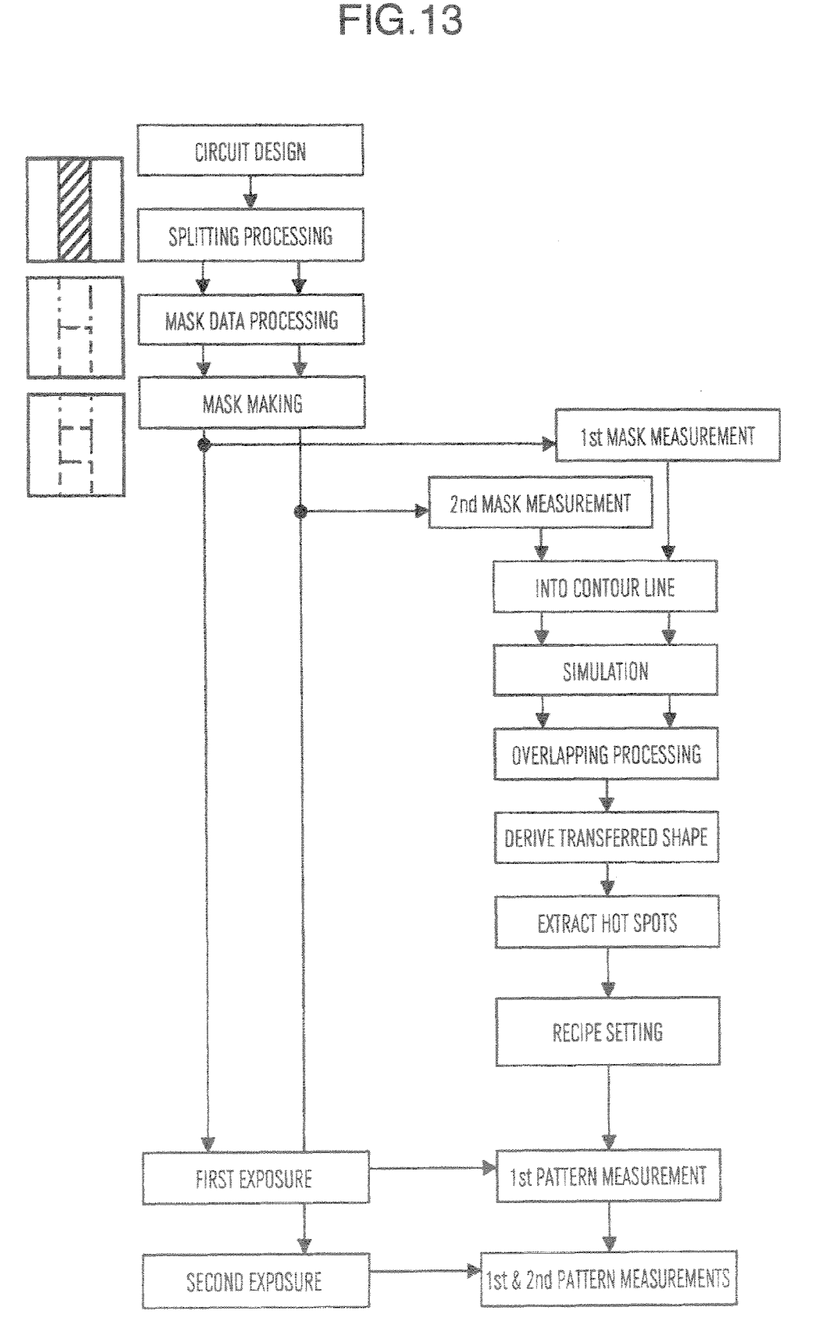
FIG. 13 is a chart illustrating a process for creating a recipe for an SEM that measures semiconductor wafers.

FIG. 13 is a diagram illustrating one example thereof, and is a diagram illustrating a recipe creation process for the SEM 1403 already described in connection with FIG. 14. The SEM 1403 is mainly intended to measure and inspect patterns transferred to semiconductor wafers by exposure using the above-described photomask or the like as described previously.

The flowchart of FIG. 13 illustrates processes for creating a recipe for measurements of actually transferred patterns by two masks from the results of a simulation based on SEM measurements of the two masks fabricated by splitting processing. That is, the flowchart illustrates processes that create a recipe for the SEM 1403 that measures semiconductor wafers and so on, based on the results of measurements performed by the SEM 1402 measuring photomasks and so on.

In particular, portions of a semiconductor wafer to be measured or inspected are extracted from the results of an overlap of the results of two simulations. A recipe is created such that an FOV is set over each of the portions. Portions on a semiconductor wafer to be measured or inspected vary variously depending on the concept of development or the like of the semiconductor manufacturer. One conceivable example is that one critical portion created by an overlap is used as a measurement position. This portion is highly likely to be a defect depending on variations in the process. Therefore, it is considered that it is selected as an evaluated portion after a transfer as well as during a mask making stage. Since positional information about the critical portion produced by the overlap is stored in the data management unit 1401, the data management unit 1401 can create a recipe for the SEM 1403 based on the information.

REFERENCE SIGNS LIST

1401: data management unit
1402: SEM (for photomask measurements)
1403: SEM (for semiconductor wafer measurements)
1404, 1405: control units
1406, 1407: communication lines
1408: external computer

The invention claimed is:

1. A pattern dimension measuring apparatus for measuring a pattern on a sample based on information obtained based on charged-particle beam irradiation of the sample, said pattern dimension measuring apparatus comprising:
    a storage medium for storing design data about a photomask subjected to double exposure; and
    an arithmetic unit for causing two sets of information obtained by exposure simulations performed respectively on first photomask image information and second photomask image information to be overlapped based on positional information about the pattern possessed by the design data, the first photomask image information and second photomask image information being obtained by the charged-particle beam irradiation of first and second photomasks split for the double exposure.

2. The pattern dimension measuring apparatus of claim 1, wherein the first photomask image information and second photomask image information are obtained by converting pattern edges of charged-particle beam images of the first photomask image and second photomask image into contour lines.

3. The pattern dimension measuring apparatus of claim 1, wherein the arithmetic unit measures dimensions of patterns on the overlapped first photomask image information and second photomask image information.

4. A pattern dimension measuring apparatus for measuring a pattern on a sample based on information obtained based on charged-particle beam irradiation of the sample, the pattern dimension measuring apparatus comprising:
    a storage medium for storing design data about a photomask subjected to double exposure; and
    a recipe setting portion for setting conditions under which the sample is irradiated with a charged-particle beam, the recipe setting portion operating to set positions at which the pattern dimensions are measured, based on positional information regarding a portion at which a first photomask and a second photomask that are split for the double exposure are separated.

* * * * *